(12) United States Patent
Kurosawa et al.

(10) Patent No.: US 6,313,233 B1
(45) Date of Patent: Nov. 6, 2001

(54) CURABLE RESIN COMPOSITION CURED PRODUCTS

(75) Inventors: Takahiko Kurosawa; Kinji Yamada; Minoru Matsubara, all of Tsukuba; Yasutake Inoue; Tomotaka Shinoda, both of Tsuchiura; Kouhei Gotou, Tsukuba, all of (JP)

(73) Assignee: Japan Synthetic Rubber Co., Ltd., Tokyo (JP)

( * ) Notice: Subject to any disclaimer, the term of this patent is extended or adjusted under 35 U.S.C. 154(b) by 0 days.

(21) Appl. No.: 09/447,952

(22) Filed: Nov. 29, 1999

Related U.S. Application Data

(62) Division of application No. 08/974,916, filed on Nov. 20, 1997, now Pat. No. 6,011,123.

(30) Foreign Application Priority Data

Nov. 20, 1996 (JP) .................................................. 8-323361
Nov. 22, 1996 (JP) .................................................. 8-327950

(51) Int. Cl.$^7$ .................................................. C08G 65/48
(52) U.S. Cl. ........................... 525/431; 525/474; 528/17; 528/26; 528/38
(58) Field of Search .................. 525/431, 474; 528/26, 38, 17

(56) References Cited

U.S. PATENT DOCUMENTS

| 4,758,476 | 7/1988 | Sekine et al. . |
| 4,927,884 | 5/1990 | Iwasawa et al. . |
| 4,996,293 | 2/1991 | Tsuyoshi ............................. 528/352 |
| 5,061,809 | * 10/1991 | Angus, Jr. et al. ................... 549/233 |
| 5,272,222 | 12/1993 | Okinoshima et al. . |
| 5,476,908 | * 12/1995 | Kishi et al. ........................... 525/393 |
| 5,733,996 | 3/1998 | De Buyl et al. ....................... 528/17 |
| 6,084,053 | * 7/2000 | Matsubara et al. ................... 528/170 |

FOREIGN PATENT DOCUMENTS

| 0 083 690 | 7/1983 | (EP) . |
| 0 297 756 | 1/1989 | (EP) . |
| 0 555 879 | 8/1993 | (EP) . |
| 0 693 517 | 1/1996 | (EP) . |

OTHER PUBLICATIONS

Patent Abstracts of Japan, vol. 17, No. 406(C–1090), Jul. 29, 1993, JP 05 078573, Mar. 30, 1993.
Derwent Abstracts, AN 94–275939, JP 06 207024, Jul. 26, 1994.
Patent Abstracts of Japan, vol. 16, No. 238(C–0946), Jun. 2, 1992, JP 04 050262, Feb. 19, 1992.
A. Kioul, et al., Journal of Non–Crystalline Solids, vol. 175, No. 2/3, pp. 169–186, "Compatibility of Polyimide–Silicate Ceramers Induced by Alkoxysilane Silane Coupling Agents", Oct. 1994.
Derwent Abstracts, JP 62 07024, Jul. 26, 1994.
Derwent Abstracts, JP 64 001769, Jan. 6, 1989.
Derwent Abstracts, JP 63 099536, Apr. 30, 1988.
Derwent Abstracts, JP 63 099236 (Corr. DE 3727565), Apr. 30, 1998.
Derwent Abstracts, DE 3727565, Mar. 3, 1988.
Derwent Abstracts, JP 60 135465, Jul. 18, 1985.
Derwent Abstracts, JP 58 013631, Jan. 26, 1983.
Derwent Abstracts, JP 58 007437 (Corr. BE 893650), Jan. 17, 1983.
Derwwent Abstracts, BE 893650, Dec. 27, 1982.
Derwent Abstracts, JP 60 65375, Mar. 8, 1994.
Derwent Abstracts, JP 53 11065, Nov. 22, 1993.
Derwent Abstracts, JP 41 89868, Jul. 8, 1992.
Derwent Abstracts, JP 41 89867, Jul. 8, 1992.
Derwent Abstracts, JP 41 89866, Jul. 8, 1992.
Derwent Abstracts, JP 40 55483, Feb. 24, 1992.
Derwent Abstracts, JP 32 45408, Nov. 1, 1991.
Derwent Abstracts, JP 22 20308, Sep. 3, 1990.

* cited by examiner

Primary Examiner—David W. Wu
Assistant Examiner—Caixia Lu
(74) Attorney, Agent, or Firm—Oblon, Spivak, McClelland, Maier & Neustadt P.C.

(57) ABSTRACT

A curable resin composition comprising (A) a hydrolyzate or a partial condensate of an organosilane compound, or both; (B) at least one compound selected from the group consisting of polyamic acids having a hydrolyzable silyl group or carboxylic acid anhydride group, or both, and polyimides having a hydrolyzable silyl group or carboxylic acid anhydride group, or both; and (C) a chelate compound or an alkoxide compound with a metal selected from the group consisting of zirconium, titanium, and aluminum, or both the chelate compound and the alkoxide compound. The resin composition can be cured and fabricated without producing no cracks into a cured product such as a semiconductor device having a low dielectric constant, high heat resistance and moisture resistance, superior adhesion to various substrate materials, superb electrical insulation properties, and low moisture absorption. Semiconductor devices using this curable resin composition as an insulating film exhibit a low electricity consumption, work at a high speed, and have excellent reliability.

15 Claims, 1 Drawing Sheet

CURABLE RESIN COMPOSITION CURED PRODUCTS

This application is a divisional application of Ser. No. 08/974,916 filed Nov. 20, 1997, now U.S. Pat. No. 6,011, 123.

BACKGROUND OF THE INVENTION

1. Field of the Invention

The present invention relates to a curable resin composition and a cured product made from the resin composition. In particular, the present invention relates to a curable resin composition comprising a polyorganosiloxane and polyimide and to a cured product thereof.

2. Description of the Background Art

Today, semiconductor devices are widely used for various electronic instruments. There are strong demands for miniaturization of semiconductor devices, small energy consumption, high speed, and reliability of semiconductor devices. Decreasing the dielectric constant and increasing heat resistance of the insulating film arranged between wiring layers has been studied as one means for satisfying these various demands.

Materials such as SiOF, organic SOG (Spin on Glass), fluorocarbon polymer, polyimide, polyparaxylylene, and benzocyclobutene polymer, for example, are currently known as materials for low dielectric constant insulating film.

The dielectric constant of these materials is decreased by incorporating a fluorine atom and/or alkyl group in the molecules of the insulating film to decrease the density or to reduce the polarity of the molecule itself. The heat resistance is increased by introducing a siloxane structure, imide bonds, or aromatic rings into the insulating film molecules.

However, among these low dielectric insulating films, films using SiOF, for instance, do not have a sufficiently low dielectric constant as compared with conventional insulating films such as films of silicon oxide which are used for semiconductor devices. The organic materials such as an organic SOG, polyimide resin, polyparaxylylene, and benzocyclobutene polymer, on the other hand, have poor heat resistance and moisture resistance. All these insulating films are thus unsatisfactory as a film with a low dielectric constant.

An alkoxysilane compound is well known as a starting material for producing polysiloxane resins by hydrolysis and the dehydration-condensation reaction following the hydrolysis.

The polysiloxane resins are thermosetting and the cured materials have superior heat resistance and insulating properties. However, if the alkoxysilane compound is used as a starting material, the resin exhibits large volume shrinkage during curing resulting in cured products with cracks. Incorporation of an acrylic resin or the like in the hydrolyzate and/or partial condensate of the alkoxysilane compound have been investigated as a means for preventing cracks during the curing operation. Some examples of such a composition which have been proposed include a composition comprising a partial condensation product of organosilane, a dispersion of colloidal silica, and a silicone-modified acrylic resin (Japanese Patent Application Laid-open No. 135465/1985), a composition comprising a condensate of organosilane, a chelate compound of zirconium alkoxide, and a hydrolyzable silyl group-containing vinyl resin (Japanese Patent Application Laid-open No. 1769/1989), and a composition comprising a partial condensate of organosilane, a hydrolyzable silyl group-containing vinyl resin, a metallic chelate compound, and a β-diketone compound and/or a β-ketoester (Japanese Patent Application Laid-open No. 58824/1992).

However, a problem with these compositions is that the heat resistance inherently possessed by a polysiloxane resin is lost in the cured products produced from these compositions.

A polyimide resin produced from tetracarboxylic acid dianhydride and a diamine compound via a polyamic acid is commonly used as an orientation film for liquid crystals, insulating film for semiconductors, protective coat, adhesive, and the like. Aromatic polyimide resins in particular have superior heat resistance and high strength and are used in applications in which these characteristics are demanded.

However, polyimide resins generally exhibit inferior electrical insulation properties and poor moisture resistance as compared with polysiloxane resins. Because of this, a method for improving a polyimide resin with a polysiloxane resin has been proposed. For example, Japanese Patent Applications Laid-open No. 7437/1983 and No. 13631/1983 disclose a method of using a dimethyl silicon oligomer shown by the formula $H_2N-(CH_2)_3-(Si(CH_3)_2O)_m-Si(CH_3)_2-NH_2$ (wherein m is an integer from 1–100) as a diamine compound which constitutes a polyimide resin. A problem in such a resin is poor heat resistance. Japanese Patent Applications Laid-open No. 99236/1988 and No. 99536/1988 disclose a method of blending a hydrolysis-condensation product of alkoxysilane and a solution of polyamide acid (specifically, polyamic acid). A drawback to these compositions is poor dispersibility of the polysiloxane component in the polyimide resin in coating films, giving rise to impaired smoothness of the coating films. Japanese Patent Application Laid-open No. 207024/1994 discloses a solution comprising an alkoxysilane hydrolyzed and condensed in a solution of a polyamide acid which possesses a specific-type silyl group. The heat resistance of coating film made from this composition may decrease if a large amount of polysiloxane is used. In addition, the mixed solution of polyamide acid and the hydrolysis-condensation product of alkoxysilane exhibits poor storage stability.

The present invention has been achieved to provide a curable resin composition and cured products overcoming the various above-described problems.

SUMMARY OF THE INVENTION

Accordingly, an object of the present invention is to provide a curable resin composition comprising:

(A) a hydrolyzate or a partial condensate of an organosilane compound, or both, and (B) at least one compound selected from the group consisting of polyamic acids having a hydrolyzable silyl group or carboxylic acid anhydride group, or both, and polyimides having a hydrolyzable silyl group or carboxylic acid anhydride group, or both.

Another object of the present invention is to provide a curable resin composition comprising, in addition to the above components (A) and (B), (C) a chelate compound or an alkoxide compound with a metal selected from the group consisting of zirconium, titanium, and aluminum, or both the chelate compound and the alkoxide compound.

In a preferred embodiment of the above curable resin composition, the organosilane compound is a silane compound represented by the following formula (1),

$(R^1)_n Si(OR^2)_{4-n}$ (1)

wherein $R^1$ is an organic group having 1–8 carbon atoms, $R^2$ indicates an alkyl group having 1–5 carbon atoms or an acyl group having 1–4 carbon atoms, and n denotes an integer from 0–2.

In another preferred embodiment of the above curable resin composition, the polyamic acid and polyimide can be obtained by reacting a tetracarboxylic acid dianhydride compound and a diamine.

Still another object of the present invention is to provide cured products obtained by curing the curable resin compositions.

Other and further objects, features and advantages of the present invention will appear more fully from the following description.

DETAILED DESCRIPTION OF THE INVENTION AND PREFERRED EMBODIMENTS

Component (A)

Figure 1:
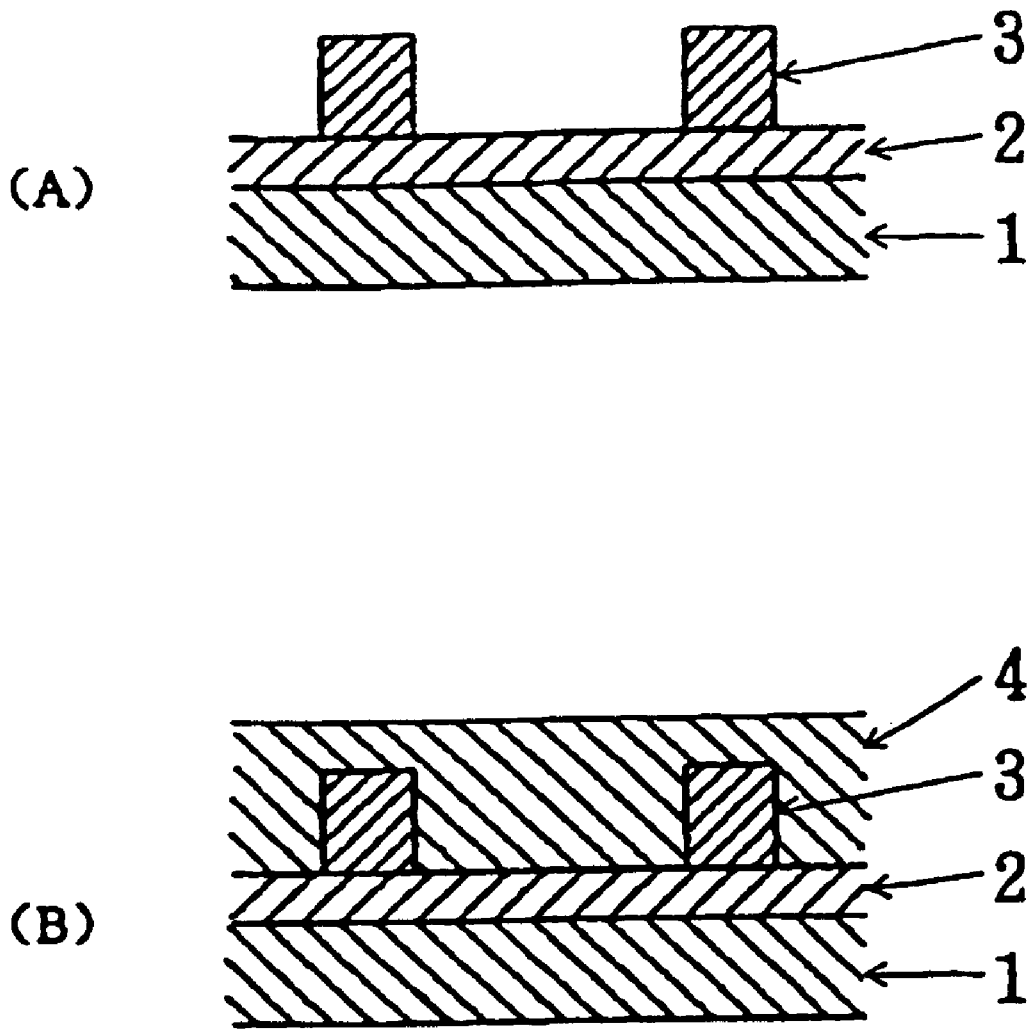
FIG. 1(A) shows an example of a semiconductor part prior to fabricating the semiconductor device and FIG. 1(B) is an example of the semiconductor device of the present invention.

The component (A) in the present invention is a hydrolyzate and/or a partial condensate of an organosilane compound. As the organosilane compound, a silane compound represented by the following formula (1) is desirable,

$(R^1)_n Si(OR^2)_{4-n}$ (1)

wherein $R^1$ is an organic group having 1–8 carbon atoms, $R^2$ indicates an alkyl group having 1–5 carbon atoms or an acyl group having 1–4 carbon atoms, and n denotes an integer from 0–2. This organosilane compound is hereinafter referred to as "silane compound (I)".

Given as examples of the organic group having 1–8 carbon atoms represented by $R^1$ in the formula (1) are linear or branched alkyl groups such as a methyl group, ethyl group, n-propyl group, i-propyl group, n-butyl group, i-butyl group, sec-butyl group, t-butyl group, n-pentyl group, n-hexyl group, n-heptyl group, and n-octyl group; 3-chloropropyl group, 3-bromopropyl group, 3,3,3-trifluoropropyl group, 3-glycidoxypropyl group, 3-(meth)acryloxypropyl group, 3-mercaptopropyl group, 3-aminopropyl group, 3-dimethylaminopropyl group, 2-(3,4-epoxycyclohexyl)ethyl group, vinyl group, and phenyl group. When two $R^1$s are present in the formula (1), those two $R^1$s may be either the same or different.

Given as examples of the alkyl group having 1–5 carbon atoms represented by $R^2$ in the formula (1) are linear or branched alkyl groups such as a methyl group, ethyl group, n-propyl group, i-propyl group, n-butyl group, i-butyl group, sec-butyl group, t-butyl group, and n-pentyl group; and as examples of the acyl group having 1–4 carbon atoms are an acetyl group, propionyl group, and butyryl group. When two to four $R^2$s are present in the formula (1), these $R^2$s may be either the same or different.

Given as specific examples of the silane compound (1) are tetraalkoxysilanes such as tetramethoxysilane, tetraethoxysilane, tetra-n-propoxysilane, tetra-i-propoxysilane, tetra-n-butoxysilane, and tetra-i-butoxysilane; alkyltrialkoxysilanes such as methyltrimethoxysilane, methyltriethoxysilane, ethyltrimethoxysilane, ethyltriethoxysilane, n-propyltrimethoxysilane, n-propyltriethoxysilane, i-propyltrimethoxysilane, i-propyltriethoxysilane, n-butyltrimethoxysilane, and i-butyltrimethoxysilane; haloalkyltrialkoxysilanes such as 3-chloropropyltrimethoxysilane, 3-chloropropyltriethoxysilane, 3,3,3-trifluoropropyltrimethoxysilane, and 3,3,3-trifluoropropyltriethoxysilane; glycidoxyalkyltrialkoxysilanes such as 3-glycidoxypropyltrimethoxysilane and 3-glycidoxypropyltriethoxysilane; (meth)acryloxyalkyltrialkoxysilanes such as 3-(meth)acryloxy propyltrimethoxysilane and 3-(meth)acryloxypropyltriethoxysilane; mercaptoalkyltrialkoxysilanes such as 3-mercaptopropyltrimethoxysilane and 3-mercaptopropyltriethoxysilane; aminoalkyltrialkoxysilanes such as 3-aminopropyltrimethoxysilane and 3-aminopropyltriethoxysilane; vinyltrialkoxysilanes such as vinyltrimethoxysilane and vinyltriethoxysilane; phenyltrialkoxysilanes such as phenyltrimethoxysilane and phenyltriethoxysilane; 3,4-epoxycyclohexylalkyltrialkoxysilanes such as 2-(3,4-epoxycyclohexyl)ethyltrimethoxysilane and 2-(3,4-epoxycyclohexyl)ethyltriethoxysilane; dialkoxysilanes such as dimethyldimethoxysilane, dimethyldiethoxysilane, diethyldimethoxysilane, diethyldiethoxysilane, di-n-propyldimethoxysilane, di-n-propyldiethoxysilane, di-i-propyldimethoxysilane, di-i-propyldiethoxysilane, diphenyldimethoxysilane, and diphenyldiethoxysilane; acyloxysilanes such as tetraacetoxysilane, methyltriacetoxysilane, ethyltriacetoxysilane, dimethyldiacetoxysilane, and diethyldiacetoxysilane. Of these silane compounds (I), tetramethoxysilane, tetraethoxysilane, methyltrimethoxysilane, methyltriethoxysilane, dimethyldimethoxysilane, and dimethyldiethoxysilane are desirable.

These silane compounds (I) may be used either individually or in combinations of two or more in the present invention.

In the present invention, the silane compound (I) may be hydrolyzed or partly condensed in advance and used as the component (A). When the component (B), which is discussed later, is formulated with the silane compound (I), a suitable amount of water is added to hydrolyze or partially condense the silane compound (I) into the component (A) when the composition is prepared.

The amount of water to be added to hydrolyze or partially condense the silane compound (I) is usually about 0.3 to 1.2 mol, and preferably 0.3 to 1 mol, per one equivalent of the alkoxysilyl group and/ or acyloxysilyl group in the silane compound (I).

The polystyrene-reduced weight average molecular weight of the component (A) measured by gel permeation chromatography (GPC) (hereinafter abbreviated as "Mw") is preferably from 2,000 to 100,000.

Component (B)

The component (B) in the present invention is at least one compound selected from the group consisting of polyamic acids having a hydrolyzable silyl group or carboxylic acid anhydride group, or both, and polyimides having a hydrolyzable silyl group or carboxylic acid anhydride group, or both.

The polyamic acid and polyimide can be obtained by reacting a tetracarboxylic acid dianhydride compound and a diamine. Here, the tetracarboxylic acid dianhydride compound is at least one compound selected from the group consisting of aliphatic tetracarboxylic acid dianhydride compounds, alicyclic tetracarboxylic acid dianhydride compounds, and aromatic tetracarboxylic acid dianhydride compounds. The diamine compound is at least one compound selected from the group consisting of aliphatic diamine compounds, alicyclic diamine compounds, and aromatic diamine compounds.

A desirable compound as such component (B) is the compound obtained by introducing the hydrolyzable silyl group shown by the following formula (2) (hereinafter called "hydrolyzable silyl group (2)") and/or the carboxylic acid anhydride group shown by the following formula (3) (hereinafter called "carboxylic acid anhydride group (3)") into the recurring unit of the polyamic acid shown by the following formula (4) (hereinafter called "recurring unit (4)") or into the recurring unit of the polyimide shown by the following formula (5) (hereinafter called "recurring unit (5)")

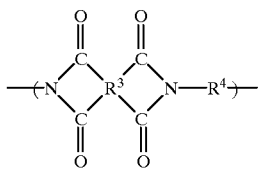

(2)

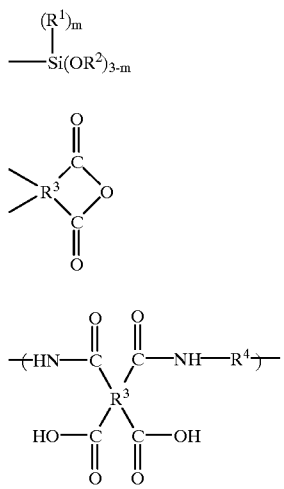

(3)

(4)

(5)

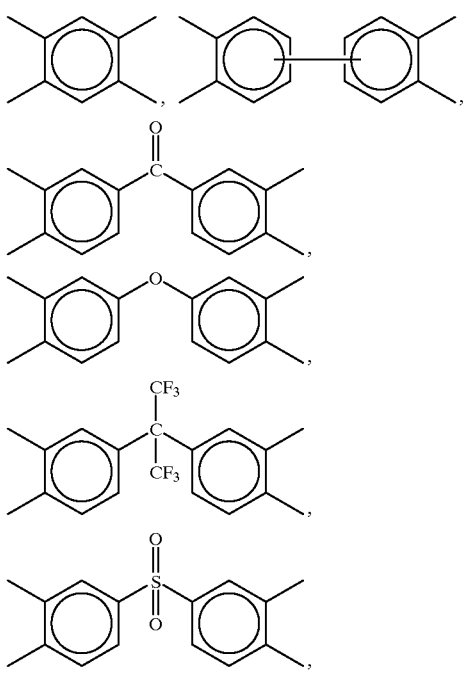

In the formula (2), $R^1$ represents an organic group having 1–8 carbon atoms, $R^2$ indicates an alkyl group having 1–5 carbon atoms or acyl group having 1–4 carbon atoms, and m is an integer from 0–2; and in the formulas (3), (4), and (5), $R^3$ is an tetra valent organic group and $R^4$ shows a divalent organic group, provided that a plurality of $R^3$s and $R^4$s in these formulas may be either the same or different.

As the organic group having 1–8 carbon atoms represented by $R^1$ and the alkyl group having 1–5 carbon atoms or the acyl group having 1–5 carbon atoms represented by $R^2$ in the formula (2), the same groups given respectively as the examples of $R^1$ and $R^2$ in the formula (1) can be given. When two $R^1$s are present in the formula (2), these two $R^1$s may be either the same or different. When two or three $R^2$s are present in the formula (2), these $R^2$s may be either the same or different. In addition, the groups $R^1$ and $R^2$ in the formula (2) may be either the same as or different from the groups $R^1$ and $R^2$ in the formula (1).

The tetravalent organic group represented by $R^3$ in the formulas (3), (4), and (5) may be an aliphatic organic group, alicyclic organic group, or aromatic organic group, with an aromatic organic group having 6–120 carbon atoms being particularly desirable.

The group represented by the following formulas can be given as the typical tetravalent aromatic organic group represented by $R^3$.

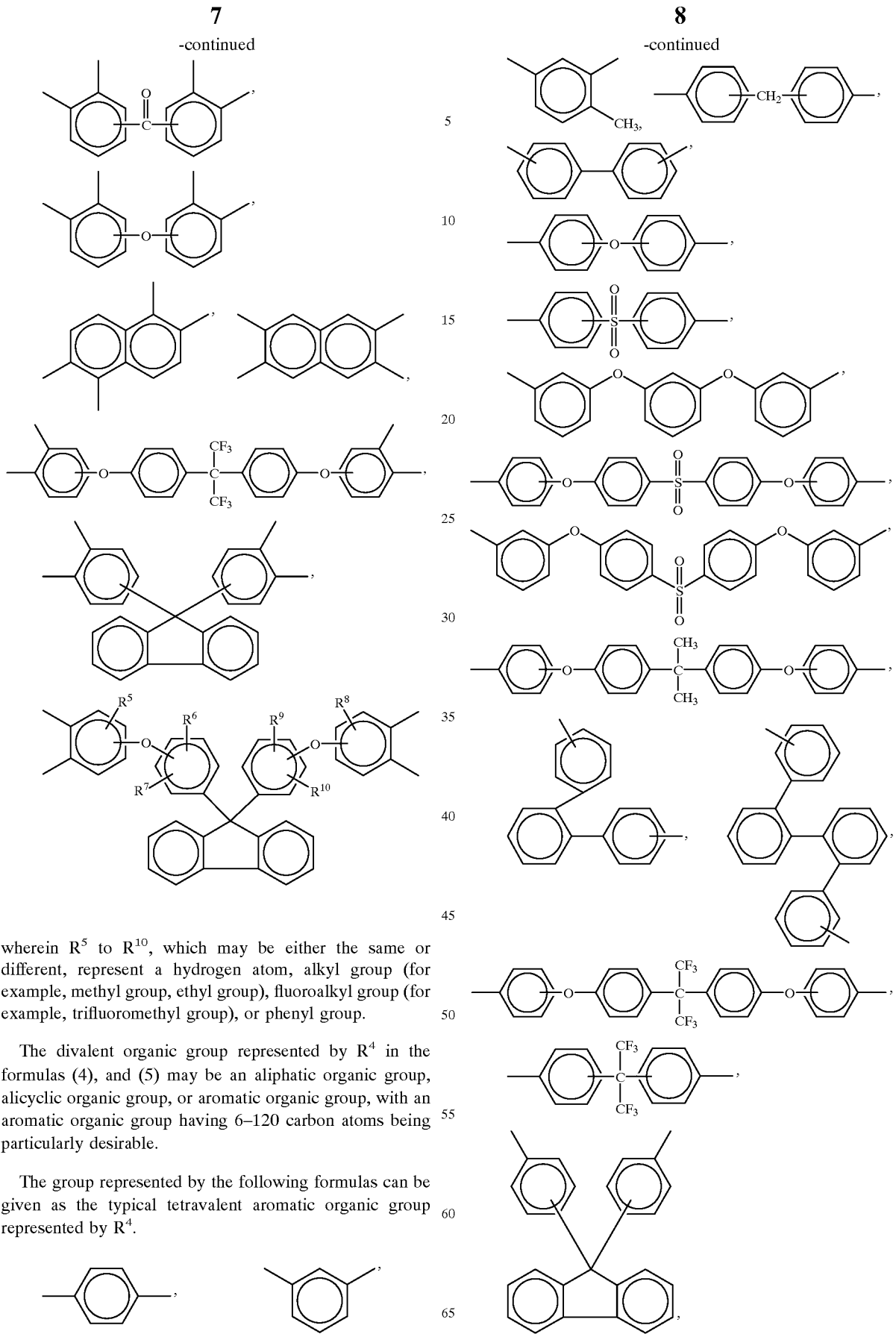

wherein $R^5$ to $R^{10}$, which may be either the same or different, represent a hydrogen atom, alkyl group (for example, methyl group, ethyl group), fluoroalkyl group (for example, trifluoromethyl group), or phenyl group.

The divalent organic group represented by $R^4$ in the formulas (4), and (5) may be an aliphatic organic group, alicyclic organic group, or aromatic organic group, with an aromatic organic group having 6–120 carbon atoms being particularly desirable.

The group represented by the following formulas can be given as the typical tetravalent aromatic organic group represented by $R^4$.

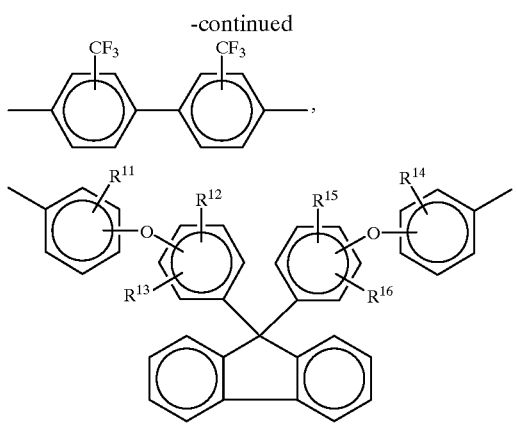

wherein $R^{11}$ to $R^{16}$, which may be either the same or different, represent a hydrogen atom, alkyl group (for example, methyl group, ethyl group), fluoroalkyl group (for example, trifluoromethyl group), or phenyl group.

As for the recurring unit (4) in the polyamic acid and the recurring unit (5) in the polyimide, either one type of these units may be present or two or more types may be present. A part of the polyamic acid in the present invention may be changed into imide and may be present as imide. The proportion of the imide should be less than 50%. On the other hand, a part of the polyimide may not be changed into imide. The proportion of the polyimide which should be changed into imide groups in the polyimide is preferably 50% or more, and more preferably 90% or more.

The component (B) of the present invention can be synthesized by various processes without specific limitations. Examples for preparing the polyamic acid or polyimide having hydrolyzable silyl group (2) are as follows.

(a) A process comprising polycondensing a tetracarboxylic acid dianhydride corresponding to the recurring unit (4) and a diamine compound corresponding to the recurring unit (4) in an organic solvent to obtain a solution of a polyamic acid, then reacting with a silane compound having a carboxylic acid anhydride group and a hydrolyzable group and/or a silane compound having a functional group which can react with the carboxyl group and a hydrolyzable group (these silane compounds are hereinafter called "functional silane compounds"), to obtain a solution of a polyamic acid having a hydrolyzable silyl group.

(b) A process comprising polycondensing a tetracarboxylic acid dianhydride corresponding to the recurring unit (4) and a diamine compound corresponding to the recurring unit (4) in an organic solvent in the presence of the functional silane compound, to obtain a solution of a polyamic acid having a hydrolyzable silyl group.

(c) A process comprising effecting a dehydration-cyclization reaction of the polyamic acid obtained by the process (a) or (b) using a thermal or chemical means in an organic solvent.

(d) A process comprising polycondensing a tetracarboxylic acid dianhydride corresponding to the recurring unit (4) and a diamine compound corresponding to the recurring unit (4) in an organic solvent to obtain a solution of a polyamic acid, subjecting this polyamic acid to a dehydration-cyclization reaction by means of a thermal method or chemical method in a solvent to obtain a polyimide, and then reacting the functional silane compound to obtain a solution of a polyimide having a hydrolyzable silyl group.

(e) A process comprising reacting (by polycondensation) a tetracarboxylic acid dianhydride corresponding to the recurring unit (4) and a silane compound having two amino groups and a hydrolyzable group, for example, a compound shown by the following formula,

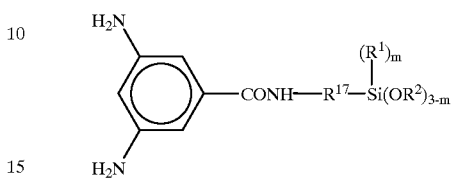

(wherein $R^1$, $R^2$, and m are respectively the same as the $R^1$, $R^2$ and m defined in the formula (2), and $R^{17}$ is a divalent organic group, preferably a phenylene group or alkylene group having 1–10 carbon atoms), optionally with a diamine compound corresponding to the formula (4), to obtain a solution of polyamic acid having a hydrolyzable silyl group.

(f) A process comprising effecting a dehydration-cyclization reaction of the polyamic acid obtained by the process (e) using a thermal means or chemical means in an organic solvent to obtain a solution of polyimide.

The polyamic acid or polyimide having the carboxylic acid anhydride group (3) can be prepared by the following processes.

(g) A process comprising polycondensing a tetracarboxylic acid dianhydride corresponding to the recurring unit (4) and a diamine compound corresponding to the recurring unit (4) using a surplus amount of the tetracarboxylic acid dianhydride in an organic solvent to obtain a solution of a polyamic acid.

(h) A process comprising effecting a dehydration-cyclization reaction of the polyamic acid obtained by the process (g) using a thermal or chemical means in an organic solvent to obtain a polyimide solution.

Of these processes, the processes (a), (d), and (e) are desirable as a process for preparing the polyamic acid or polyimide having the hydrolyzable silyl group (2), and, in particular, the processes (a) and (d) are preferred. The process (h) is desirable as a process for preparing the polyamic acid or polyimide possessing the carboxylic acid anhydride group (3).

A combination of one of the processes (a) to (f) and either one of the processes (g) and (h) may be used for preparing the polyamic acid or polyimide which possesses both the hydrolyzable silyl group (2) and the carboxylic acid anhydride group (3).

The following compounds can be given as examples of the tetracarboxylic acid dianhydride used in the present invention:

2,2',3,3'-biphenyltetracarboxylic acid dianhydride,
2,3,3',4'-biphenyltetracarboxylic acid dianhydride,
3,3',4,4'-biphenyltetracarboxylic acid dianhydride,
2,2-bis(3,4-dicarboxyphenyl)-1,1,1,3,3,3-hexafluoropropane dianhydride, 9,9-bis[4-(3,4-dicarboxyphenoxy)phenyl]fluorene dianhydride, 2,2-bis[(2,3-dicarboxyphenyl)]-1,1,1,3,3,3-hexafluoropropane dianhydride,
9,9-bis [4-(2,3-dicarboxyphenoxy)phenyl]fluorene dianhydride, 9,9-bis[(3,4-dicarboxyphenyl)]fluorene dianhydride,
9,9-bis(2,3-dicarboxyphenyl)]fluorene dianhydride,
2,2-bis[4-(3,4-dicarboxyphenoxy)phenyl]-1,1,1,3,3,3-hexafluoropropane dianhydride, and
2,2-bis[4-(2,3-dicarboxyphenoxy)phenyl]-1,1,1,3,3,3-hexafluoropropane dianhydride.

The diamine compounds used in the present invention include: 9,9-bis[(4-aminophenyl)]fluorene,
9,9-bis[4-(4-aminophenoxy)phenyl]fluorene,
2,2-bis[(4-aminophenyl)]-1,1,1,3,3,3-hexafluoropropane,
2,2-bis[4-(4-aminophenoxy)phenyl]-1,1,1,3,3,3-hexafluoropropane, 4,4'-diaminophenyl ether, 9,9-bis[3-phenyl-4-(4-amino-2-trifluoromethylphenoxy)phenyl]fluorene,
9,9-bis(3-aminophenyl)fluorene,
9,9-bis(2-aminophenyl)fluorene,
9,9-bis[4-(3-aminophenoxy)phenyl]fluorene,
9,9-bis[4-(2-aminophenoxy)phenyl]fluorene,
2,2-bis(3-aminophenyl)-1,1,1,3,3,3-hexafluoropropane,
2,2-bis(2-aminophenyl)-1,1,1,3,3,3-hexafluoropropane,
2,2-bis[4-(3-aminophenoxy)phenyl]-1,1,1,3,3,3-hexafluoropropane, 2,2-bis[4-(2-aminophenoxy)phenyl]-1,1,1,3,3,3-hexafluoropropane, 3,4'-diaminophenyl ether,
3,3'-diaminophenyl ether, 2,4'-diaminophenyl ether,
2,3'-diaminophenyl ether, 2,21'-diaminophenyl ether,
2,2'-diaminobiphenyl, 2,3'-diaminobiphenyl,
2,4'-diaminobiphenyl, 3,3'-diaminobiphenyl,
3,4'-diaminobiphenyl, 4,4'-diaminobiphenyl,
4,4'-diamino-2,2'-trifluoromethylbiphenyl,
2,2'-diamino-4,4'-trifluoromethylbiphenyl,
2-(3-amino phenyl)-2'-aminobiphenyl, and
2,2'-bis(3-aminophenyl)biphenyl, The following compounds can be given as examples of the functional silane compound which is used in the preparation of the polyamic acid or polyimide possessing the hydrolyzable silyl group (2): carboxylic acid anhydride group-containing silanes such as acid anhydride of 3,4-dicarboxyphenyltrimethoxysilane and acid anhydride of 3,4-dicarboxybenzyltrimethoxysilane; mercaptosilanes such as mercaptomethyltrimethoxysilane,
2-mercaptoethyltrimethoxysilane,
3-mercaptopropyltrimethoxysilane, and
3-mercaptopropyldimethoxymethylsilane; amino silanes such as 3-aminopropyltrimethoxysilane,
3-aminopropyltriethoxysilane,
3-aminopropyldimethoxymethylsilane,
3-aminopropyldiethoxymethylsilane,
3-aminopropyldimethylmethoxysilane,
3-aminopropyldimethylethoxysilane,
(2-aminoethylamino)methyltrimethoxysilane,
3-(2-aminoethylamino)propyltrimethoxysilane,
3-(2-aminoethylamino)propyldimethoxymethylsilane,
3-[2-(2-aminoethylamino)ethylamino]propyltrimethoxysilane,
N-(3-trimethoxysilylpropyl)urea,
N-(3-triethoxysilylpropyl)urea,
2-(2-aminoethylthio)ethyltrimethoxysilane,
2-(2-aminoethylthio)ethyltriethoxysilane,
2-(2-aminoethylthio)ethyldimethoxymethylsilane, and
2-(2-aminoethylthio)ethyldiethoxymethylsilane; imino silanes such as bis(3-trimethoxysilylpropyl)amine, bis(3-triethoxysilylpropyl)amine,
3-cyclohexylaminopropyltrimethoxysilane,
3-cyclohexylaminopropyldimethoxymethylsilane,
3-phenylaminopropyltrimethoxysilane,
3-phenylaminopropyldimethoxymethylsilane,
3-benzylaminopropyltrimethoxysilane,
3-benzylaminopropyldimethoxymethylsilane,
3-(p-vinylbenzylamino)propyltrimethoxysilane,
3-(p-vinylbenzylamino)propyldimethoxymethylsilane,
3-allylaminopropyltrimethoxysilane,
3-allylaminopropyldimethoxymethylsilane,
3-piperazinopropyltrimethoxysilane, and
3-piperazinopropyldimethoxymethylsilane; epoxy silanes such as 3-glycidoxypropyltrimethoxysilane,
3-glycidoxypropyltriethoxysilane,
3-glycidoxypropyldimethoxymethylsilane,
3-glycidoxypropyldiethoxymethylsilane,
2-(3,4-epoxycyclohexyl)ethyltrimethoxysilane, and
2-(3,4-epoxycyclohexyl)ethyldimethoxymethylsilane; isocyanate silanes such as
3-isocyanatepropyltrimethoxysilane,
3-isocyanatepropyltriethoxysilane,
3-isocyanatepropyldimethoxymethylsilane, and
3-isocyanatepropyldiethoxymethylsilane;
4-aminophenyltrimethoxysilane,
4-aminophenyltriethoxysilane,
3-aminophenyltrimethoxysilane,
3-aminophenyltriethoxysilane, and
2-aminophenyltrimethoxysilane, and
2-aminophenyltriethoxysilane.

These functional silane compounds may be used either individually or in combinations of two or more.

Any organic solvents which are inert to and capable of dissolving the raw materials and the component (B) can be used in the above-described processes without any specific limitations. Enumerated as examples of such organic solvents are: aliphatic hydrocarbon solvents such as n-pentane, i-pentane, n-hexane, i-hexane, n-heptane, i-heptane, 2,2,2-trimethyl pentane, n-octane, i-octane, cyclohexane, and methyl cyclohexane; aromatic hydrocarbon solvents such as benzene, toluene, xylene, ethylbenzene, trimethylbenzene, n-propylbenzene, i-propylbenzene, n-butylbenzene, methylethylbenzene, diethylbenzene, triethylbenzene, di-i-propylbenzene, and n-amylnaphthalene; ketone solvents such as acetone, methyl ethyl ketone, methyl n-propyl ketone, methyl i-propyl ketone, methyl n-butyl ketone, methyl i-butyl ketone, methyl n-pentyl ketone, methyl n-hexyl ketone, diethyl ketone, ethyl n-propyl ketone, ethyl n-butyl ketone, di-n-propyl ketone, di-i-propyl ketone, di-n-butyl ketone, di-i-butyl ketone, cyclohexanone, 2-methylcyclohexanone, 3-methylcyclohexanone, 4-methylcyclohexanone, 2,4-pentanedion, acetonylacetone, diacetone alcohol, acetophenone, and fenchone; ether solvents such as ethyl ether, n-propyl ether, i-propyl ether, n-butyl ether, n-hexyl ether, 2-ethylhexyl ether, ethylene oxide, 1,2-propylene oxide, dioxolane, 4-methyl dioxolane, dioxane, dimethyldioxane, ethylene glycol monomethyl ether, ethylene glycol monoethyl ether, ethylene glycol goods-n-propyl ether, ethylene glycol mono-n-butyl ether, ethylene glycol mono-n-hexyl ether, ethylene glycol mono-2-ethyl butyl ether, ethylene glycol monophenyl ether, ethylene glycol dimethyl ether, ethylene glycol diethyl ether, ethylene glycol di-n-propyl ether, ethylene glycol di-n-butyl ether, diethylene glycol monomethyl ether, diethylene glycol monoethyl ether, diethylene glycol mono-n-propyl ether, diethylene glycol mono-n-butyl ether, diethylene glycol mono-n-hexyl ether, diethylene glycol dimethyl ether, diethylene glycol diethyl ether, diethylene glycol di-n-propyl ether, diethylene glycol di-n-butyl ether, ethoxy triglycol, tetraethylene glycol dimethyl ether, tetraethylene glycol diethyl ether, tetraethylene glycol di-n-propyl ether, tetraethylene glycol di-n-butyl ether, propylene glycol monomethyl ether, dipropylene glycol monomethyl ether, tripropylene glycol monomethyl ether, tetrahydrofuran, 2-methyl tetrahydrofuran, ester-based solvents such as diethylene carbonate, γ-butyrolactone, γ-valerolactone, methyl acetate, ethyl acetate, n-propyl acetate, i-propyl acetate, n-butyl acetate, i-butyl acetate, sec-butyl acetate, n-pentyl acetate, sec-pentyl acetate, 3-methoxybutyl acetate, 1-methylpentyl acetate, 2-ethylbutyl acetate, 2-ethylhexyl acetate, benzyl acetate, cyclohexyl acetate, 1-methylcyclohexyl acetate, 2-methylcyclohexyl acetate, 3-methylcyclohexyl acetate, 4-methylcyclohexyl acetate, n-nonyl acetate, methyl acetoacetate, ethyl acetoacetate, ethylene glycol monomethyl ether acetate, ethylene glycol monoethyl etheracetate, diethylene glycol monomethyl ether acetate, diethylene glycol monoethyl ether acetate, ethylene glycol mono-n-propyl ether acetate, ethylene glycol mono-n-butyl ether acetate, diethylene glycol mono-n-propyl ether acetate, diethylene glycol mono-n-butyl ether acetate, propylene glycol monomethyl ether acetate, propylene glycol monoethyl ether acetate, propylene glycol mono-n-propyl ether acetate, glycol diacetate, methoxytriglycol acetate, ethyl propionate, n-propyl propionate, i-propyl propionate, n-butyl propionate, i-butyl propionate, n-amyl propionate, i-amyl propionate, oxalate diethyl, di-n-propyl oxalate, di-n-butyl oxalate, lactate methyl lactate, ethyl lactate, n-propyl lactate, n-butyl lactate, n-amyl lactate, diethyl malonate, dimethyl phthalate, diethyl phthalate, methyl pyruvate, ethyl pyruvate, n-propyl pyruvate, n-butyl pyruvate, methyl α-methoxypropionate, ethyl α-methoxypropionate, n-propyl α-methoxypropionate, n-butyl α-methoxypropionate, methyl α-ethoxypropionate, ethyl α-ethoxypropionate, n-propyl α-ethoxypropionate, and n-butyl α-ethoxypropionate; nitrogen-containing solvents such as N-methylformamide, N,N-dimethylformamide, N,N-diethylformamide, acetamide, N-methylacetamide, N,N-dimethylacetamide, N-methylpropioneamide, and N-methylpyrrolidone; and sulphur-containing solvents such as dimethyl sulfide, diethyl sulfide, thiophene, tetrahydrothiophene, dimethylsulfoxide, sulfolane, and 1,3-propanesultone.

These organic solvents may be used either individually or in combinations of two or more.

For preparing the polyamic acid using the above-described processes, the tetracarboxylic acid dianhydride and diamine compound, in an amount of 1–50 wt %, preferably 2–30 wt %, of the total amount of the solution, are reacted at a temperature of below 150° C., preferably 0–120° C.

In the above processes (c), (d), (f), and (h), the temperature for the thermal method for the synthesis of the polyimide is usually 50 to 400 ° C., and preferably 100 to 350 ° C., whereas the temperature for the chemical reaction for producing the polyimide is usually 0 to 200° C.

Although the hydrolyzable silyl group (2) and/or the carboxylic acid anhydride group (3) in the component (B) of the present invention usually exist at both ends of the molecule chain of the polyamic acid or polyimide, one of these groups may be present at only one terminal.

The content of the hydrolyzable silyl group (2) in the component (B) is usually 0.1 to 70 wt %, preferably 0.5 to 60 wt %, and particularly preferably 1 to 50 wt %. The content of the carboxylic acid amhydride group (3) in the component (B) is usually 0.01 to 30 wt %, preferably 0.05 to 25 wt %, and particularly preferably 0.1 to 20 wt %. When the component (B) possesses both the hydrolyzable silyl group (2) and the carboxylic acid anhydride group (3), the content of each group is respectively selected from the range respectively defined for these groups.

The logarithmic viscosity [η] (in N-methylpyrrolidone at 30° C., 0.5 g/dl) of the component (B) of the present invention is usually 0.05 to 5 dl/g, and preferably 0.1 to 3 dl/g.

The compounds of the component (B) may be used either individually or in combinations of two or more in the present invention.

The amount of the component (B) to be incorporated into the composition of the present invention is usually 5 to 1000 parts by weight, preferably 10 to 800 parts by weight, and more preferably 15 to 600 parts by weight, for 100 parts by weight of the component (A) after the hydrolysis-partial condensation reaction. If the amount of the component (B) is less than 5 parts by weight, cracks may be produced when the resin composition is cured; if more than 1000 parts by weight, the moisture resistance of the cured products may be poor.

Component (C)

It is desirable for the curable resin composition of the present invention to further comprise (i) a chelate compound or an alkoxide compound with a metal selected from the group consisting of zirconium, titanium, and aluminum, or both the chelate compound and the alkoxide compound (hereinafter collectively called component (C)) The compounds of component (C) are considered to accelerate the condensation reaction between the component (A) and component (B) and promote formation of the cocondensation product of these two components.

Given as examples of the compounds used as the component (C) are the compounds shown by the following formulas or partial hydrolyzates of these compounds.

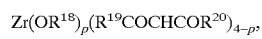

$Zr(OR^{18})_p(R^{19}COCHCOR^{20})_{4-p}$,

$Ti(OR^{18})_q(R^{19}COCHCOR^{20})_{4-q}$, and

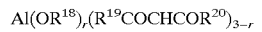

$Al(OR^{18})_r(R^{19}COCHCOR^{20})_{3-r}$ wherein, $R^{18}$ and $R^{19}$ may be either the same or different and each individually represents a linear or branched alkyl group having 1–6 carbon atoms such as an ethyl group, n-propyl group, i-propyl group, n-butyl group, i-butyl group, sec-butyl group, t-butyl group, n-pentyl group, and n-hexyl group; $R^{20}$ is a linear or branched alkyl group having 1–5 carbon atoms such as an ethyl group, n-propyl group, i-propyl group, n-butyl group, i-butyl group, sec-butyl group, t-butyl group, and n-pentyl group or a linear or branched alkoxyl group having 1–16 carbon atoms such as a methoxy group, ethoxy group, n-propoxy group, i-propoxy group, n-butoxy group, i-butoxy group, sec-butoxy group, t-butoxy group, lauryloxy group, and stearyloxy group (when two or more groups for $R^{18}$, $R^{19}$, or $R^{20}$ are present, these two or more groups may be either the same or different); p and q are individually an integer from 0–3; and r is an integer from 0–2.

Specific examples of the compounds used as component (C) include zirconium chelate compounds such as tri-n-butoxy-ethylacetoacetate zirconium, di-n-butoxy-bis (ethylacetoacetate)zirconium, n-butoxy-tris (ethylacetoacetate)zirconium, tetrakis(n-propylacetoacetate) zirconium, tetrakis(acetylacetoacetate)zirconium, and tetrakis(ethylacetoacetate)zirconium; titanium chelate compounds such as di-i-propoxy-bis(ethylacetoacetate)titanium, di-i-propoxy-bis(acetylacetate)titanium, di-i-propoxy-bis (acetylacetate) titanium, tri-n-butoxy-ethylacetoacetate titanium, tri-i-propoxy-ethylacetoacetate titanium, tri-n-butoxy-acetoacetate titanium, tri-i-propoxy-acetoacetate titanium, di-n-butoxy-bis(ethylacetoacetate)titanium, di-n-butoxy-bis(acetoacetate)titanium, n-butoxy-tris (ethylacetoacetate) titanium, n-butoxy-tris(acetoacetate) titanium, tetrakis(ethylacetoacetate)titanium, and tetrakis (acetoacetate)titanium; aluminum chelate compounds such as di-i-propoxy-ethylacetoacetate aluminum, di-i-propoxy-acetylacetate aluminum, i-propoxy-bis(ethylacetoacetate) aluminum, i-propoxy-bis(acetylacetate)aluminum, tris (ethylacetoacetate) aluminum, tris(acetylacetate)aluminum, and monoacetylacetate-bis(ethylacetoacetate)aluminum; zirconium alkoxide compounds such as tetra-i-propoxy zirconium and tetra-n-butoxy zirconium; titanium alkoxide compound such as tetra-i-propoxy titanium and tetra-n-butoxy titanium; and aluminum alkoxide compounds such as tri-i-propoxy aluminum and tri-n-butoxy aluminum.

Of these compounds, tri-n-butoxy-ethylacetoacetate zirconium, di-i-propoxy-bis(acetylacetate)titanium, di-i-propoxy-ethylacetoacetate aluminum, and tris (ethylacetoacetate)aluminum are desirable.

The compounds of component (C) may be used either individually or in combinations of two or more.

The amount of the component (C) used in the curable resin composition of the present invention is usually 0.1 to 100 parts by weight, preferably 0.3 to 80 parts by weight, and particularly preferably 0.5 to 60 parts by weight, for 100 parts by weight of the total amount of the component (A) and component (B). If the amount of the component (C) is less than 0.1 parts by weight, the heat resistance of the cured products tends to be impaired. If more than 100 parts by weight, cracks may be produced during a curing operation for the resin composition.

It is desirable to incorporate the following component (D) with the curable resin composition of the present invention, in addition to the components (A), (B), and (C).

Component (D)

The component(D) is a β-diketone and/or β-keto ester shown by the formula, $R^{19}COCH_2COR^{20}$, wherein $R^{19}$ and $R^{20}$ are respectively the same as those defined in the above formulas representing the metal chelate compounds for the component (C) (the groups of $R^{19}$ and $R^{20}$ in the component (C) and those in the component (D) may differ.).

The component (D) is effective for further improving the storage stability of the curable resin composition.

This effect of the component (D) is thought to be provided by the action of the compound of component (D) in conjugating with the metal atom in the metallic chelate compound of the component(C), thereby suitably controlling the effect of said metal chelate compound in accelerating the condensation reaction between the component (A) and the component (B). The storage stability of the curable resin composition can thus be increased.

Given as specific examples of the compound of component (D) are acetylacetone, methyl acetoacetate, ethyl acetoacetate, n-propyl acetoacetate, i-propyl acetoacetate, n-butyl acetoacetate, i-butyl acetoacetate, sec-butyl acetoacetate, t-butyl acetoacetate, 2,4-hexanedione, 2,4-heptanedione, 3,5-heptanedione, 2,4-octanedione, 3,5-octanedione, 2,4-nonanedione, 3,5-nonanedione, and 5-methyl-2,4-hexanedione.

Among these compounds, acetylacetone and ethyl acetoacetate are desirable, with acetylacetone being particularly desirable.

These compounds of component (D) may be used either individually or in combinations of two or more.

The amount of the component (D) used in the curable resin composition of the present invention is usually 2 mols or more, preferably 3 to 20 mols, and particularly preferably 4 to 15 mols, per 1 mol of the component (C). If the amount of the component (D) is less than 2 mols, there will be no significant increase in the storage stability of the curable resin composition.

Other additives

According to the curing conditions of the curable resin composition of the present invention, addition of at least one curing accelerator (hereinafter referred to as component (E)) is effective. The addition of the component (E) is particularly effective when the resin composition is cured at comparatively low temperatures.

The following compounds can be given as examples of the component (E): alkali metal salts of naphthenic acid, octyl acid, nitrous acid, sulfurous acid, aluminic acid, or carbonic acid; alkaline compounds such as sodium hydroxide and potassium hydroxide; acidic compounds such as alkyl titanic acid, phosphoric acid, p-toluenesulfonic acid, and phthalic acid; amines such as 1,2-ethylenediamine, 1,6-hexylenediamine, diethylenetriamine, triethylenetetramine, tetraethylenepentamine, piperidine, piperazine, m-phenylenediamine, p-phenylenediamine, ethanolamine, triethylamine, and N-methylmorpholine; various modified amines used as curing agents of epoxy resin; amino group-containing silanes such as 3-aminopropyltriethoxysilane, 3-(2-aminoethylamino) propyltrimethoxysilane, 3-(2-aminoethylamino) propyldimethoxymethylsilane, and 3-anilinopropyltrimethoxysilane; carboxylic acid type organotin compounds such as $(C_4H_9)_2Sn(OCOC_{11}H_{23})_2$, $(C_4H_9)_2Sn(OCOCH=CHCOOCH_3)_2$, $(C_4H_9)_2Sn(OCOCH=CHCOOC_4H_9)_2$, $(C_8H_{17})_2Sn(OCOC_{11}H_{23})_2$, $(C_8H_{17})_2Sn(OCOCH=CHCOOCH_3)_2$, $(C_8H_{17})_2Sn(OCOCH=CHCOOC_4H_9)_2$, $(C_8H_{17})_2Sn(OCOCH=CHCOOC_8H_{17})_2$, and $Sn(OCOC_8H_{17})_2$; mercaptide type organotin compounds such as $(C_4H_9)_2Sn(SCH_2COO)_2$, $(C_4H_9)_2Sn(SCH_2COOC_8H_{17})_2$, $(C_8H_{17})_2Sn(SCH_2COO)_2$, $(C_8H_{17})_2Sn(SCH_2CH_2COO)_2$, $(C_8H_{17})_2Sn(SCH_2COOCH_2CH_2OCOCH_2S)_2$, $(C_8H_{17})_2Sn(SCH_2COOCH_2CH_2CH_2CH_2OCOCH_2S)_2$, $(C_8H_{17})_2Sn(SCH_2COOC_8H_{17})_2$, $(C_8H_{17})_2Sn(SCH_2COOC_{12}H_{25})_2$, and the compound of the formula,

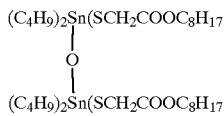

sulfide type organotin compounds such as $(C_4H_9)_2Sn=S$, $(C_8H_{17})_2Sn=S$, and the compound of the formula,

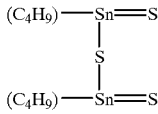

oxide type organotin oxides such as $(C_4H_9)_2Sn=O$ and $(C_8H_{17})_2Sn=O$. and reaction products of these organotin compounds and esters such as ethyl silicate, dimethyl maleate, and octyl phthalate.

These compounds of component (E) may be used either individually or in combinations of two or more.

The amount of the component (E) used in the resin composition of the present invention is usually 15 wt % or less, preferably 10 wt % or less, of the total amount of the solid components in the components (A) to (E).

Incidentally, the component (C) also exhibits an action as a curing accelerator.

The component (E) can be added to the curable resin composition of the present invention by any appropriate means without any specific limitations either during preparation or after preparation of the composition. Other additives such as dispersing agents, thickeners, leveling agents, silane coupling agents, titanium coupling agents, and dehydrating agent such as o-methyl formate, o-methyl acetate, or tetraethoxysilane, can be optionally added to the curable resin composition of the present invention.

Preparation of Curable Resin Composition

The curable resin composition of the present invention can be prepared by producing a composition comprising the component (A) and the component (B) as essential components, and preferably further comprising the component (C), and optionally adding the component (D) to the resulting composition.

Particularly desirable processes for preparing the curable resin composition are the following processes ① to ④.

① A process comprising preparing a mixture of the silane compound (1), component (B), and component (C), adding water to the mixture in an amount of 0.3 to 1 mol for one equivalent of the alkoxy silyl group and/or acyloxy silyl group in the silane compound (1) to hydrolyze or partially condensate the silane compound (1) to obtain a composition comprising components (A) to (C), an then adding the component (D), as required.

② A process comprising preparing a mixture of a portion of the component (B) and the component (C), adding the silane compound (1) and the remaining portion of the component (B) and the component (C), and adding water in an amount of 0.3 to 1 mol for one equivalent of the alkoxy silyl group and/or acyloxy silyl group in the silane compound (1) to hydrolyze or partially condensate the silane compound (1) to obtain a composition comprising the components (A) to (C), and then adding the component (D), as required.

③ A process comprising adding water to the silane compound (1) in the amount of 0.3 to 1 mol for one equivalent of the alkoxy silyl group and/or acyloxy silyl group in the silane compound (1) to hydrolyze or partially condensate the silane compound (1), adding the component (B) and the component (C) separately or a mixture of the component (B) and the component (C) prepared previously, either at one time or gradually in portions, to further carry out the condensation reaction, to obtain a composition comprising the components (A) to (C), and then adding the component (D), as required.

④ A process comprising adding water to a mixture of the silane compound (1) and a portion of the component (C) in an amount of 0.3 to 1 mol for one equivalent of the alkoxy silyl group and/or acyloxy silyl group in the silane compound (1) to hydrolyze or partially condense the silane compound (1), adding the component (B) and the remaining portion of the component (C) separately or a mixture of these prepared previously, either at one time or gradually in portions, to further carry out the condensation reaction, to obtain a composition comprising the components (A) to (C), and then adding the component (D), as required.

The component (E) and other additives may be added to the resin composition at any optional stage in these processes ① to ④.

An organic solvent can be used to adjust the total solid component concentration and the viscosity of the curable resin composition of the present invention.

Any organic solvents which are inert to and capable of dissolving the curable resin composition can be used without any specific limitations.

Given as examples of such organic solvents are: aliphatic hydrocarbon solvents such as n-pentane, i-pentane, n-hexane, i-hexane, n-heptane, i-heptane, 2,2,4-trimethyl pentane, n-octane, i-octane, cyclohexane, and methyl cyclohexane; aromatic hydrocarbon solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, and n-amylnaphthalene; monohydric alcohol solvents such as methanol, ethanol, n-propanol, i-propanol, n-butanol, i-butanol, sec-butanol, t-butanol, n-pentanol, i-pentanol, 2-methyl butanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, n-undecyl alcohol, sec-undecyl alcohol, trimethylnonyl alcohol, n-tetradecyl alcohol, sec-tetradecyl alcohol, n-heptadecyl alcohol, sec-heptadecyl alcohol, cyclohexanol, 1-methylcyclohexanol, 2-methylcyclohexanol, 3-methylcyclohexanol, 4-methylcyclohexanol, 3,3,5-trimethylcyclohexanol, benzyl alcohol, phenylmethyl carbinol, diacetone alcohol, phenol, and cresol; polyhydric alcohol solvents such as ethylene glycol, 1,2-propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol, and glycerol; ketone solvents such as acetone, methyl ethyl ketone, methyl n-propyl ketone, methyl i-propyl ketone, methyl n-butyl ketone, methyl i-butyl ketone, methyl n-pentyl ketone, methyl n-hexyl ketone, diethyl ketone, ethyl n-propyl ketone, ethyl n-butyl ketone, di-n-propyl ketone, di-i-propyl ketone, di-n-butyl ketone, di-i-butyl ketone, cyclohexanone, 2-methyl cyclohexanone, 3-methyl cyclohexanone, 4-methyl cyclohexanone, 2,4-pentanedione, acetonylacetone, diacetone alcohol, acetophenone, and fenchone; ether solvents such as ethyl ether, n-propyl ether, i-propyl ether, n-butyl ether, n-hexyl ether, 2-ethylhexyl ether, ethylene oxide, 1,2-propylene oxide, dioxorane, 4-methyl dioxorane, dioxane, dimethyl dioxane, ethylene glycol monomethyl ether, ethylene glycol monoethyl ether, ethylene glycol mono-n-propyl ether, ethylene glycol mono-n-butyl ether, ethylene glycol mono-n-hexyl ether, ethylene glycol mono-2-ethyl butyl ether, ethylene glycol mono phenyl ether, ethylene glycol di methyl ether, ethylene glycol di ethyl ether, ethylene glycol di-n-propyl ether, ethylene glycol di-n-butyl ether, diethylene glycol monomethyl ether, diethylene glycol monoethyl ether, diethylene glycol mono-n-propyl ether, diethylene glycol mono-n-butyl ether, diethylene glycol mono-n-hexyl ether, diethylene glycol dimethyl ether, diethylene glycol diethyl ether, diethylene glycol di-n-propyl ether, diethylene glycol di-n-butyl ether, ethoxytriglycol, tetraethylene glycol dimethyl ether, tetraethylene glycol diethyl ether, tetraethylene glycol di-n-propyl ether, tetraethylene glycol di-n-butyl ether, propylene glycol monomethyl ether, dipropylene glycol monomethyl ether, tripropylene glycol monomethyl ether, tetrahydrofuran, and 2-methyl tetrahydrofuran; ester-based solvents such as diethylene carbonate, γ-butyrolactone, γ-valerolactone, methyl acetate, ethyl acetate, n-propyl acetate, i-propyl acetate, n-butyl acetate, i-butyl acetate, sec-butyl acetate, n-pentyl acetate, sec-pentyl acetate, 3-methoxybutyl acetate, 1-methylpentyl acetate, 2-ethylbutyl acetate, 2-ethylhexyl acetate, benzyl acetate, cyclohexyl acetate, 1-methylcyclohexyl acetate, 2-methylcyclohexyl acetate, 3-methylcyclohexyl acetate, 4-methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, ethylene glycol mono-n-propyl ether acetate, ethylene glycol mono-n-butyl ether acetate, diethylene glycol mono-n-propyl ether acetate, diethylene glycol mono-n-butyl ether acetate, propylene glycol monomethyl ether acetate, propylene glycol monoethyl ether acetate, propylene glycol mono-n-propyl ether acetate, glycol diacetate, methoxy triglycol acetate, ethyl propionate, n-propyl propionate, i-propyl propionate, n-butyl propionate, i-butyl propionate, n-amyl propionate, i-amyl propionate, diethyl oxalate, di-n-propyl oxalate, di-n-butyl oxalate, methyl lactate, ethyl lactate, n-propyl lactate, n-butyl lactate, n-amyl lactate, diethyl malonate, dimethyl phthalate, diethyl phthalate, methyl pyruvate, ethyl pyruvate, n-propyl pyruvate, n-butyl pyruvate, methyl α-methoxypropionate, ethyl α-methoxypropionate, n-propyl α-methoxypropionate, n-butyl α-methoxypropionate, methyl α-ethoxypropionate, ethyl (α-ethoxypropionate, n-propyl α-ethoxypropionate, and n-butyl α-ethoxypropionate; nitrogen-containing solvents such as N-methylformamide, N,N-dimethylformamide, N,N-diethylformamide, acetamide, N-methylacetamide, N,N-dimethylacetamide, N-methylpropioneamide, and N-methylpyrrolidone; sulphur-containing solvents such as dimethyl sulfide, diethyl sulfide, thiophene, tetrahydrothiophene, dimethylsulfoxide, sulfolane, and 1,3-propanesultone.

These organic solvents may be used either individually or in combinations of two or more.

Cured Products

The resin composition of the present invention can cured by heating. When the cured product is a coating, the thickness is usually in the range of 100 μm to 1000 μm. The heating time is usual in the range of 30 to 120 minutes.

Semiconductor Devices

The cured products made from the curable resin composition of the present invention is useful as an insulating film in various electronic and electrical instruments, particularly as an insulating film in semiconductor devices having a wiring layer and an insulating film on the wiring layer.

A semiconductor device having an insulating film using the curable resin of the present invention and a method for preparing such an insulating film will now be explained referring to FIG. 1. FIG. 1(A) shows an example of a semiconductor part prior to fabricating the semiconductor device and FIG. 1(B) is an example of the semiconductor device of the present invention.

Referring to FIG. 1(A), on the surface of a silicone substrate 1 in which a transistor has been formed a first insulating film 2 is formed from suitable material such as SiOF, organic SOG, fluorocarbon polymer, polyimide, polyparaxylylene, benzocyclobutene polymer, or the like. A first wiring layer 3 is then formed on this first insulating film. Illustrating a process for manufacturing such a semiconductor device, a silicon oxide film with a thickness of 500 to 1000 nm is formed by a heat oxidation method, CVD (vapor phase chemical growth) method, plasma CVD method, or the like on the silicone substrate 1. Next, a metallic film consisting of aluminum or an aluminum alloy with a thickness of 400 to 600 nm is formed by a sputtering technique. The metallic film is subjected to a patterning operation by photographic lithography or a dry etching process, thus forming a wiring layer 3.

Secondly, the curable resin composition of the present invention is applied to the surfaces of the wiring layer 3 and the first insulating film 2 of the thus-fabricated semiconductor parts by a spin coating method to produce a film thickness of 100 to 1000 nm, for example. The coating film is cured and dried at 350° C. for 60 minutes, thus obtaining an insulating film 4 which consists of the cured product of the curable resin composition of the present invention. A semiconductor device of the present invention shown in FIG. 1(B) is obtained in this manner.

The semiconductor device and the method of manufacture should not be limited to the embodiments illustrated here. For instance, the first wiring layer 3 may be made of copper or a copper alloy; polycrystalline silicon or polyside may be incorporated in the metallic material forming the first wiring layer 3; the insulating film made from the curable resin composition of the present invention may also be used as the first insulating film 2; a silicon oxide film by the CVD method or the like may be provided additionally between the first wiring layer 3 and the insulating film 4; multiple wiring layers may be provided, with an insulating film of the present invention formed between the wiring layers and, as required, electrically connecting the wiring layers by means of through-holes; and the upper surface of the insulating film of the present invention on the outermost layer may be treated by a mechanochemical abrasive or the like to make the surface flat.

Because the insulating film of the present invention has a low dielectric constant, high heat resistance and moisture resistance, superior adhesion to various substrate materials, superb electrical insulation properties, and low moisture absorption, the semiconductor device with this insulating film formed on wiring layers exhibits a low electricity consumption rate, works at a high speed, and has excellent reliability.

Other features of the invention will become apparent in the course of the following description of the exemplary embodiments which are given for illustration of the invention and are not intended to be limiting thereof.

EXAMPLES

In the examples below "%" and "parts" indicate "% by weight" and "parts by weight", respectively, unless otherwise specified.

Preparation Example 1
<Synthesis of Component (B)>

Bis(3,4-dicarboxyphenyl)sulfone dianhydride (25.0 parts) and 2,2-bis[4-(4-aminophenoxy)phenyl]propane (24.6 parts) were reacted in N-methyl pyrrolidone (450 parts) for two hours at 25° C. and three hours at 180° C. Water in the reaction solution was removed by azeotropic distillation while adding toluene dropwise, thus obtaining a 10% solution of polyimide containing a carboxylic acid anhydride group.

Preparation Example 2
<Synthesis of Component (B)>

3-Aminopropyltrimethoxysilane (3.59 parts) was added to the polyimide solution which was produced in the same manner as in Preparation Example 1 and the mixture was reacted for two hours at 25° C. Then, 3-isocyanatepropyltrimethoxysilane (4.1 parts) was added and the mixture was reacted for another two hours at 120° C., thereby obtaining a 10% solution of polyimide which contains hydrolyzable silyl groups.

Preparation Example 3
<Synthesis of Component (B)>

2,2-Bis(3,4-dicarboxyphenyl)-1,1,1,3,3,3-hexafluoropropane dianhydride (50.2 parts) and 9,9-bis[4-(4-aminophenoxy)phenyl]fluorene (53.5 parts) were reacted in methyl methoxypropionate (400 parts) for two hours at 23° C., then three hours at 145° C. Water in the reaction solution was removed by azeotropic distillation while adding toluene dropwise, thus obtaining a 20% solution of polyimide containing a carboxylic acid anhydride group.

Preparation Example 4
<Synthesis of Component (B)>

2,213,31-Biphenyltetracarboxylic acid dianhydride (25.2 parts) and 9,9-bis(4-aminophenyl)fluorene (27.7 parts) were reacted in γ-butyrolactone (450 parts) for two hours at 23° C., then three hours at 180° C. Water in the reaction solution was removed by azeotropic distillation while adding toluene dropwise, thus obtaining a 10% solution of the component (B)

Example 1

A polyimide solution (100 parts) obtained in the Preparation Example 1 and di-n-butoxy-bis(ethylacetoacetate) zirconium (10 parts) were reacted for 20 minutes at 23° C. After the addition of methyltrimethoxysilane (100 parts or 49 parts as a solid portion), di-n-butoxy-bis (ethylacetoacetate) zirconium (2 parts), and ion-exchanged water (14 parts), the mixture was reacted for a further 4 hours at 60 ° C. Then, acetylacetone (5 parts) was added, followed by a further one-hour reaction at 60° C., thus obtaining a curable resin composition with a solid portion concentration of 15%.

Examples 2–3

Curable resin compositions were prepared in the same manner as in Example 1, except that the components in Table 1 were used in the proportions listed in Table 1.

Example 4

Methyltrimethoxysilane (100 parts or 49 parts as a solid portion), the polyimide solution obtained in the Preparation Example 2 (100 parts), di-i-propoxy-ethylacetoacetate aluminum (5 parts), ion exchanged water (14 parts), and N-methylpyrrolidone (80 parts) were reacted for four hours at 60° C. Then, after the addition of acetylacetone (5 parts), the mixture was reacted for one hour at 60° C., thus obtaining a curable resin composition with a solid portion concentration of 20%.

Examples 5–6

Curable resin compositions were prepared in the same manner as in Example 4, except that the components in Table 1 were used in the proportions listed in Table 1.

TABLE 1

|  | Example | | | | | |
|---|---|---|---|---|---|---|
|  | 1 | 2 | 3 | 4 | 5 | 6 |
| Component (A) | | | | | | |
| Tetraethoxysilane |  |  | 10 |  |  | 10 |
| Methyltrimethoxysilane | 100 | 80 | 70 | 100 | 80 | 70 |
| Phenyltrimethoxysilane |  |  | 20 |  |  | 20 |

TABLE 1-continued

|  | Example | | | | | |
|---|---|---|---|---|---|---|
|  | 1 | 2 | 3 | 4 | 5 | 6 |
| Dimethoxydimethylsilane |  | 20 |  |  | 20 |  |
| Solid portion of component (A) | 49 | 52 | 50 | 49 | 52 | 50 |
| Component (B) |  |  |  |  |  |  |
| Preparation Example 1 (10% solution) | 500 | 100 | 2000 |  |  |  |
| Preparation Example 2 |  |  |  | 100 | 2000 | 500 |
| Preparation Example 3 (20% solution) |  |  |  |  |  |  |
| Preparation Example 4 (10% solution) |  |  |  |  |  |  |
| Component (C) |  |  |  |  |  |  |
| Di-n-butoxy-bis(ethylacetoacetate) zirconium | 10 + 2 |  | 40 + 0 |  |  |  |
| Di-i-propoxy-bis(ethylacetoacetate) titanium |  | 2 + 2 |  |  |  |  |
| Di-i-propoxyethylacetoacetate aluminum |  |  |  | 5 |  |  |
| Di-i-propoxy-bis(acetylacetate) titanium |  |  |  |  | 5 |  |
| Tri-n-butoxyethylacetoacetate zirconium |  |  |  |  |  | 0.5 |
| Component (D) |  |  |  |  |  |  |
| Acetylacetone | 5 | 5 |  | 5 |  |  |
| Ethyl acetoacetate |  |  |  |  | 5 |  |
| Methyl methoxypropionate |  |  |  |  |  |  |
| γ-Butylolactone |  |  |  |  |  |  |
| Ion exchanged water | 14 | 13 | 13 | 14 | 13 | 13 |
| N-Methylpyrrolidone |  |  |  | 80 |  |  |
| Solid component concentration (%) | 15 | 13 | 13 | 20 | 12 | 16 |
| Storage stability | ○ | ○ | ○ | ○ | ○ | ○ |

Example 7

The polyimide solution obtained in the Preparation Example 3 (250 parts), di-n-butoxybis(ethylacetoacetate) zirconium (21.1 parts), methyl methoxypropionate (296 parts), and γ-butyrolactone (394 parts) were reacted for 20 minutes at 23° C. Then, after the addition of methyltrimethoxysilane (100 parts or 49 parts of solid portion) and ion-exchanged water (19.9 parts), the mixture was reacted for four hour at 60° C., thus obtaining a heat curable resin composition with a solid portion concentration of 10%.

Example 8

The polyimide solution (28.1 parts) obtained in the Preparation Example 3, di-n-butoxybis(ethylacetoacetate) zirconium (16.2 parts), methyl methoxypropionate (42 parts), and γ-butyrolactone (259 parts) were reacted for 20 minutes at 23° C. After the addition of methyltrimethoxysilane (92.3 parts or solid portion of 45.5 parts) and phenyltrimethoxysilane (7.7 parts or solid portion of 5.0 parts), the mixture was heated to 60° C. Then, ion exchanged water (15.5 parts) was added in one hour, followed by a reaction for three hours at 60° C. Methanol in the reaction mixture was evaporated under vacuum, thus providing a heat curable resin composition with a solid portion concentration of 13%.

Example 9

The polyimide solution obtained in the Preparation Example 3 (28.1 parts), di-i-propoxybis(ethylacetoacetate) titanium (12.5 parts), methyl methoxypropionate (42 parts), γ-butyrolactone (259 parts) were reacted for one hour at 60° C. After the addition of methyltrimethoxysilane (92.3 parts or solid portion of 45.5 parts) and phenyltrimethoxysilane (7.7 parts or solid portion of 5.0 parts), the mixture was heated to 60° C. Then, ion-exchanged water (15.5 parts) was added in one hour, followed by a reaction for three hours at 60° C. Methanol in the reaction mixture was evaporated under vacuum, thus providing a heat curable resin composition with a solid portion concentration of 13%.

Example 10

Methyltrimethoxysilane (92.3 parts or solid portion of 45.5 parts), phenyltrimethoxysilane (7.7 parts or solid portion of 5.0 parts), di-i-propoxybis(ethylacetoacetate) titanium (9.4 parts), methyl methoxypropionate (209 parts), and γ-butyrolactone (69 parts) were mixed at 60 ° C., and ion exchanged water (15.5 parts) was added in one hour, followed by a reaction for one hour. Methanol in the reaction solution was evaporated under vacuum. To the residue, the polyimide solution (56.1 parts) prepared in the Preparation Example 4, di-i-propoxybis(ethylacetoacetate)titanium (7.6 parts), and γ-butyrolactone (152 parts) were added, and the mixture was reacted for one hour at 60 ° C. To the reaction mixture, di-i-propoxybis(ethylacetoacetate)titanium (14.0 parts) and ion exchanged water (1.9 parts) were further added, followed by a reaction for one hour at 60° C. A heat curable resin composition with a solid portion concentration of 10% was obtained.

TABLE 2

|  | Example | | | |
|---|---|---|---|---|
|  | 7 | 8 | 9 | 10 |
| Component (A) |  |  |  |  |
| Methyltrimethoxysilane | 100 | 92.3 | 92.3 | 92.3 |
| Phenyltrimethoxysilane |  | 7.7 | 7.7 | 7.7 |
| Solid portion of component (A) | 49 | 50.5 | 50.5 | 50.5 |
| Component (B) |  |  |  |  |

TABLE 2-continued

|  | Example | | | |
|---|---|---|---|---|
|  | 7 | 8 | 9 | 10 |
| Preparation Example 2 (20% solution) | 250 | 28.1 | 28.1 |  |
| Preparation Example 3 (10% solution) |  |  |  | 56.1 |
| Component (C) |  |  |  |  |
| Di-n-butoxy-bis(ethylacetoacetate) zirconium | 21.1 | 16.2 |  |  |
| Di-i-propoxy-bis(ethylacetoacetate) titanium |  |  | 12.5 | 9.4/7.6/14.0 |
| Methyl methoxypropionate | 296 | 42 | 42 | 209 |
| γ-Butyrolactone | 394 | 259 | 259 | 69/152 |
| Ion exchanged water | 19.9 | 15.5 | 15.5 | 15.5/1.9 |
| Solid component concentration (%) | 10 | 13 | 13 | 10 |
| Storage stability | ○ | ○ | ○ | ○ |

Comparative Examples 1–3

Curable resin compositions were prepared in the same manner as in Example 1, except that the components in Table 3 were used in the proportions listed in Table 3.

Comparative Examples 4–6

Curable resin compositions were prepared in the same manner as in Example 4, except that the components in Table 3 were used in the proportions listed in Table 3.

TABLE 3

|  | Comparative Example | | | | | |
|---|---|---|---|---|---|---|
|  | 1 | 2 | 3 | 4 | 5 | 6 |
| Component (A) |  |  |  |  |  |  |
| Tetraethoxysilane |  |  |  |  |  | 10 |
| Methyltrimethoxysilane | 100 | 100 |  | 100 | 80 | 70 |
| Phenyltrimethoxysilane |  |  |  |  |  | 20 |
| Dimethoxydimethylsilane |  |  |  |  | 20 |  |
| Solid portion of component (A) | 49 | 49 | — | 49 | 52 | 50 |
| Component (B) |  |  |  |  |  |  |
| Preparation Example 1 (10% solution) | 500 | 100 | 500 |  |  |  |
| Preparation Example 2 |  |  |  | 100 | 2000 | 500 |
| Preparation Example 3 (20% solution) |  |  |  |  |  |  |
| Preparation Example 4 (10% solution) |  |  |  |  |  |  |
| Component (C) |  |  |  |  |  |  |
| Di-n-butoxy-bis(ethylacetoacetate) zirconium |  | 10 + 2 | 10 + 0 |  |  |  |
| Di-i-propoxy-bis(ethylacetoacetate) titanium |  |  |  |  |  |  |
| Di-i-propoxyethylacetoacetate aluminum |  |  |  |  | 5 |  |
| Di-i-propoxy-bis(acetylacetate) titanium |  |  |  |  |  |  |
| Tri-n-butoxyethylacetoacetate zirconium |  |  |  |  |  |  |
| Component (D) |  |  |  |  |  |  |
| Acetylacetone |  |  | 5 |  | 10 |  |
| Ethyl acetoacetate |  |  |  |  |  |  |
| Ion exchanged water | 14 | 14 |  | 14 | 14 |  |
| N-Methylpyrrolidone |  |  |  | 80 |  |  |
| Solid component concentration (%) | 14 | 35 | 10 | 20 | 40 | 10 |

Evaluation

The curable resin composition prepared in Examples 1–10 and Comparative Examples 1–6 were evaluated according to the following methods. The results are shown in Table 4.

Crack Resistance

The curable resin composition specimen is applied to a glass plate using an applicator with a slit width of 254 μm. The coating was cured and dried at 350° C. for 60 minutes. The appearance of the coating film was observed by the naked eye. The specimens were rated according to the following standard.
 ○: No cracks were observed.
 ×: There were cracks observed.

Adhesion

The curable resin composition was applied to various substrates using a No. 6 bar coater. After curing and drying at 350° C. for 60 minutes, the cross-cut test was carried out three times according to JIS K5400. The adhesion was evaluated by counting the number of squares (average number (n)) remaining in 100 squares on a cross-cut test board.

Heat Resistance ①

The curable resin composition was placed in an aluminum pan and cured and dried at 350° C. for 60 minutes. The cured specimen was heated at the rate of 10° C./minute. The heat resistance was evaluated by measuring the temperature corresponding to a 5% weight loss of the specimen using a SSC5200™ thermogravimetric analyzer (TGA), manufactured by Seiko Electronics Industry Co., Ltd.

Heat resistance ②

The curable resin composition was placed in an aluminum pan and dried under reduced pressure of 1 Torr at 450° C. for 60 minutes. The cured specimen was heated at the rate of 10° C./minute under a nitrogen atmosphere. The heat resistance was evaluated by measuring the temperature corresponding to a 5% weight loss of the specimen using a SSC5200™ thermogravimetric analyzer (TGA), manufactured by Seiko Electronics Industry Co., Ltd.

Moisture-heat Resistance

The curable resin composition was applied to various substrates using a No. 6 bar coater. After curing and drying at 350° C. for 60 minutes, the specimen was subjected to the conditions of 121° C., 100% humidity, and 2 atm for 250 hours. Then, the above adhesion test was carried out to evaluate the moisture-heat resistance of the specimen.

Dielectric Constant ①

The curable resin composition was applied to a stainless steel plate using a spinner. After curing and drying at 350° C. for 60 minutes, the dielectric constant of the specimen at 1 MHz was measured using HP16451B™ electrodes and a HP4284A™ precision LCR meter, both manufactured by Yokogawa-Hewlett Packard, Ltd.

Dielectric Constant ②

The curable resin composition was applied to a stainless steel plate using a spinner. After curing and drying under reduced pressure of 1 Torr or less at 450° C. for 60 minutes, the dielectric constant of the specimen at 1 MHz was measured using HP16451B™ electrodes and a HP4284A™ precision LCR meter, both manufactured by Yokogawa-Hewlett Packard, Ltd.

Water Absorption

The curable resin composition was applied to a silicon wafer using a spinner. After curing and drying at 350° C. for 60 minutes, the specimen was allowed to stand at 85° C. and 85% humidity for 24 hours. The water absorption was evaluated from the weight change after the 24 hours.

tion properties, and low moisture absorption. Semiconductor devices using this curable resin composition as an insulating film exhibit a low electricity consumption, work at a high speed, and have excellent reliability.

Obviously, numerous modifications and variations of the present invention are possible in light of the above teachings. It is therefore to be understood that within the scope of the appended claims, the invention may be practiced otherwise than as specifically described herein.

What is claimed is:

1. A curable resin composition, consisting essentially of:
   (A) a hydrolyzate or a partial condensate of an organosilane compound, or both;
   (B) at least one compound containing a fluorene structure which is selected from the group consisting of a polyamic acid having a hydrolyzable silyl group or carboxylic acid anhydride group, or both, and a polyimide having a hydrolyzable silyl group or carboxylic acid anhydride group, or both; and
   (i) a solvent.

2. The curable resin composition according to claim 1, wherein the organosilane compound is represented by formula (1), $$(R^1)_n Si(OR^2)_{4-n} \qquad (1)$$

wherein $R^1$ is an organic group having 1–8 carbon atoms, $R^2$ indicates an alkyl group having 1–5 carbon atoms or an acyl group having 1–4 carbon atoms, and n denotes an integer from 0–2.

TABLE 4

| | Example | | | | | | | | | | Comparative Example | | | | | |
|---|---|---|---|---|---|---|---|---|---|---|---|---|---|---|---|---|
| | 1 | 2 | 3 | 4 | 5 | 6 | 7 | 8 | 9 | 10 | 1 | 2 | 3 | 4 | 5 | 6 |
| Crack resistance | ○ | ○ | ○ | ○ | ○ | ○ | ○ | ○ | ○ | ○ | ○ | X | ○ | ○ | X | ○ |
| Adhesion (n/100) | | | | | | | | | | | | | | | | |
| Glass substrate | 100 | 100 | 100 | 100 | 100 | 100 | 100 | 100 | 100 | 100 | 100 | 100 | 100 | 100 | 100 | 100 |
| Aluminum substrate | 100 | 100 | 100 | 100 | 100 | 100 | 100 | 100 | 100 | 100 | 100 | 100 | 100 | 100 | 100 | 100 |
| Copper substrate | 100 | 100 | 100 | 100 | 100 | 100 | 100 | 100 | 100 | 100 | 100 | 100 | 100 | 100 | 100 | 100 |
| Silicon wafer | 100 | 100 | 100 | 100 | 100 | 100 | 100 | 100 | 100 | 100 | 100 | 100 | 100 | 100 | 100 | 100 |
| Dielectric constant (1 MHz) | | | | | | | | | | | | | | | | |
| ① dried at 350° C. in air | 2.8 | 2.7 | 3.1 | 2.8 | 3.3 | 2.9 | 2.5 | 2.3 | 2.2 | 2.5 | 3.1 | — | 3.4 | 3.3 | — | 3.6 |
| ② dried at 450° C. under vacuum | | | | | | | 2.6 | 2.1 | 2.0 | 2.3 | | | | | | |
| Heat resistance (5% weight loss temp.) | | | | | | | | | | | | | | | | |
| ① dried at 350° C. in air | 520 | 530 | 500 | 510 | 480 | 500 | 530 | >600 | >600 | >600 | 460 | 540 | 480 | 510 | 480 | 500 |
| ② dried at 450° C. under vacuum | | | | | | | 550 | >600 | >600 | >600 | | | | | | |
| Moisture-heat resistance (120° C. × 250 Hrs) | | | | | | | | | | | | | | | | |
| Glass substrate | 100 | 100 | 100 | 100 | 100 | 100 | 100 | 100 | 100 | 100 | 70 | 100 | 30 | 100 | 100 | 100 |
| Aluminum substrate | 100 | 100 | 100 | 100 | 100 | 100 | 100 | 100 | 100 | 100 | 60 | 100 | 30 | 100 | 100 | 100 |
| Copper substrate | 100 | 100 | 100 | 100 | 100 | 100 | | | | | 80 | 100 | 20 | 100 | 100 | 100 |
| Silicon wafer | 100 | 100 | 100 | 100 | 100 | 100 | 100 | 100 | 100 | 100 | 70 | 100 | 30 | 100 | 100 | 100 |
| Water absorption (%) | 0.5 | 0.4 | 0.6 | 0.5 | 0.7 | 0.4 | | | | | 0.5 | — | 2.0 | 0.5 | 0.7 | 0.4 |

The curable resin composition of the present invention produces no cracks when the cured products are fabricated. The resulting cured products have a low dielectric constant, high heat resistance and moisture resistance, superior adhesion to various substrate materials, superb electrical insula- 3. The curable resin composition according to claim 2, wherein in formula (1) n is 0 or 1.

4. The curable resin composition according to claim 1, wherein the polyamic acid and polyimide are obtained by reacting a tetracarboxylic acid dianhydride compound and a diamine.

5. The curable resin composition according to claim 4, wherein the tetracarboxylic acid dianhydride compound is at least one compound selected from the group consisting of 9,9-bis[4-(3,4-dicarboxyphenoxy)phenyl]fluorene dianhydride, 9,9-bis[(3-4-dicarboxyphenyl)fluorene dianhydride, and 9,9-bis[(2,3-diancarboxyphenyl)fluorene dianhydride.

6. The curable resin composition according to claim 4, wherein the diamine compound is at least one compound selected from the group consisting of 9,9-bis[(4-aminophenyl)]fluorene, 9,9-bis[(4-(4-aminophenoxy)phenyl]-fluorene, 9,9-bis[3-phenyl-4-(4-amino-2-trifluoromethyl-phenoxy)phenyl]-fluorene, 9,9-bis(3-aminophenyl)fluorene, 9,9-bis(2-aminophenyl)fluorene, 9,9-bis 4-(3-aminophenoxy)phenyl fluorene, and 9,9-bis[4-(2-aminophenoxy)phenyl]fluorene.

7. The curable resin composition according to claim 4, wherein the tetracarboxylic acid dianhydride compound is an aromatic tetracarboxylic acid dianhydride compound and the diamine compound is an aromatic diamine compound.

8. The curable resin composition according to claim 1, containing 5 to 1000 parts by weight of the component (B) for 100 parts by weight of the component (A) after a hydrolysis-partial condensation reaction.

9. The curable resin composition according to claim 1, containing 5 to 1000 parts by weight of the component (B) for 100 parts by weight of the component (A) after a hydrolysis-partial condensation reaction, and further containing 0.1 to 100 parts by weight of a component (C) for 100 parts by weight of the total amount of the component (A) and component (B);
    wherein (C) is a chelate compound or an alkoxide compound with a metal selected from the group consisting of zirconium, titanium and aluminum, or a mixture of said chelate compound and said alkoxide compound.

10. A cured product, obtained by curing a curable resin composition comprising
    (A) a hydrolyzate or a partial condensate of an organosilane compound, or both; and
    (B) at least one compound containing a fluorene structure which is selected from the group consisting of a polyamic acid having a hydrolyzable silyl group or carboxylic acid anhydride group, or both, and a polyimide having a hydrolyzable silyl group or carboxylic acid anhydride group, or both;
    wherein the organosilane compound is represented by formula (1)

$$(R^1)_n Si(OR^2)_{4-n} \quad (1)$$

wherein $R^1$ is an organic group having 1–8 carbon atoms, $R^2$ indicates an alkyl group having 1–5 carbon atoms or an acyl group having 1–4 carbon atoms, and n denotes an integer from 0–2.

11. The curable resin composition according to claim 10, wherein in formula (1) n is 0 or 1.

12. A curable resin composition, comprising:
    (A) a hydrolyzate or a partial condensate of an organosilane compound, or both;
    (B) at least one compound containing a fluorene structure which is selected from the group consisting of a polyamic acid having a hydrolyzable silyl group or carboxylic acid anhydride group, or both, and a polyimide having a hydrolyzable silyl group or carboxylic acid anhydride group, or both;
    (C) a chelate compound or an alkoxide compound with a metal selected from the group consisting of zirconium, titanium and aluminum, or a mixture of said chelate compound and said alkoxide compound; and
    optionally (D) a β-diketone and/or β-keto ester of formula $$R^{19}COCH_2COR^{20},$$

wherein $R^{19}$ represents a linear or branched alkyl group having 1–6 carbon atoms and $R^{20}$ represents a linear or branched alkyl group having 1–5 carbon atoms;
    wherein said composition is prepared by a method comprising:
    preparing a mixture of a silane compound of formula (1), component (B), and component (C);
    wherein the compound of formula (1) is $$(R^1)_n Si(OR^2)_{4-n} \quad (1)$$

wherein $R^1$ is an organic group having 1–8 carbon atoms, $R^2$ indicates an alkyl group having 1–5 carbon atoms or an acyl group having 1–4 carbon atoms, and n denotes an integer from 0–2;
    adding water to said mixture in an amount of 0.3 to 1 mol for one equivalent of the alkoxy silyl group and/or acyloxy silyl group in compound (1) to hydrolyze or partially condensate compound (1) to obtain a composition comprising components (A) to (C); and
    optionally adding the component (D).

13. A curable resin composition, comprising:
    (A) a hydrolyzate or a partial condensate of an organosilane compound, or both;
    (B) at least one compound containing a fluorene structure which is selected from the group consisting of a polyamic acid having a hydrolyzable silyl group or carboxylic acid anhydride group, or both, and a polyimide having a hydrolyzable silyl group or carboxylic acid anhydride group, or both;
    (C) a chelate compound or an alkoxide compound with a metal selected from the group consisting of zirconium, titanium and aluminum, or a mixture of said chelate compound and said alkoxide compound; and
    optionally (D) a β-diketone and/or β-keto ester of formula $$R^{19}COCH_2COR^{20},$$

wherein $R^{19}$ represents a linear or branched alkyl group having 1–6 carbon atoms and $R^{20}$ represents a linear or branched alkyl group having 1–5 carbon atoms;
    wherein said composition is prepared by a method comprising:
    preparing a mixture of a portion of the component (B) and the component (C);
    adding a silane compound (1) and the remaining portion of the component (B) and the component (C);
    wherein the compound of formula (1) is $$(R^1)_n Si(OR^2)_{4-n} \quad (1)$$

wherein $R^1$ is an organic group having 1–8 carbon atoms, $R^2$ indicates an alkyl group having 1–5 carbon atoms or an acyl group having 1–4 carbon atoms, and n denotes an integer from 0–2;

adding water in an amount of 0.3 to 1 mol for one equivalent of the alkoxy silyl group and/or acyloxy silyl group in the silane compound (1) to hydrolyze or partially condensate the silane compound (1) to obtain a composition comprising the components (A) to (C); and optionally adding the component (D).

14. A curable resin composition, comprising:

(A) a hydrolyzate or a partial condensate of an organosilane compound, or both;

(B) at least one compound containing a fluorene structure which is selected from the group consisting of a polyamic acid having a hydrolyzable silyl group or carboxylic acid anhydride group, or both, and a polyimide having a hydrolyzable silyl group or carboxylic acid anhydride group, or both;

(C) a chelate compound or an alkoxide compound with a metal selected from the group consisting of zirconium, titanium and aluminum, or a mixture of said chelate compound and said alkoxide compound; and optionally (D) a β-diketone and/or β-keto ester of formula $$R^{19}COCH_2COR^{20},$$

wherein $R^{19}$ represents a linear or branched alkyl group having 1–6 carbon atoms and $R^{20}$ represents a linear or branched alkyl group having 1–5 carbon atoms;

wherein said composition is prepared by a method comprising:

adding water to a silane compound (1) in an amount of 0.3 to 1 mol for one equivalent of the alkoxy silyl group and/or acyloxy silyl group in the silane compound (1) to hydrolyze or partially condensate the silane compound (1);

wherein the compound of formula (1) is $$(R^1)_n Si(OR^2)_{4-n} \qquad (1)$$

wherein $R^1$ is an organic group having 1–8 carbon atoms, $R^2$ indicates an alkyl group having 1–5 carbon atoms or an acyl group having 1–4 carbon atoms, and n denotes an integer from 0–2;

adding the component (B) and the component (C) separately or a mixture of the component (B) and the component (C) prepared previously, either at one time or gradually in portions, to further carry out the condensation reaction, thereby obtaining a composition comprising the components (A) to (C); and optionally adding the component (D).

15. A curable resin composition, comprising:

(A) a hydrolyzate or a partial condensate of an organosilane compound, or both;

(B) at least one compound containing a fluorene structure which is selected from the group consisting of a polyamic acid having a hydrolyzable silyl group or carboxylic acid anhydride group, or both, and a polyimide having a hydrolyzable silyl group or carboxylic acid anhydride group, or both;

(C) a chelate compound or an alkoxide compound with a metal selected from the group consisting of zirconium, titanium and aluminum, or a mixture of said chelate compound and said alkoxide compound; and optionally (D) a β-diketone and/or β-keto ester of formula $$R^{19}COCH_2COR^{20},$$

wherein $R^{19}$ represents a linear or branched alkyl group having 1–6 carbon atoms and $R^{20}$ represents a linear or branched alkyl group having 1–5 carbon atoms;

wherein said composition is prepared by a method comprising:

adding water to a mixture of a silane compound (1) and a portion of the component (C) in an amount of 0.3 to 1 mol for one equivalent of the alkoxy silyl group and/or acyloxy silyl group in the silane compound (1) to hydrolyze or partially condense the silane compound (1);

wherein the compound of formula (1) is $$(R^1)_n Si(OR^2)_{4-n} \qquad (1)$$

wherein $R^1$ is an organic group having 1–8 carbon atoms, $R^2$ indicates an alkyl group having 1–5 carbon atoms or an acyl group having 1–4 carbon atoms, and n denotes an integer from 0–2;

adding the component (B) and the remaining portion of the component (C) separately or a mixture of these prepared previously, either at one time or gradually in portions, to further carry out the condensation reaction, thereby obtaining a composition comprising the components (A) to (C); and optionally adding the component (D).

* * * * *

UNITED STATES PATENT AND TRADEMARK OFFICE
CERTIFICATE OF CORRECTION

PATENT NO.     : 6,313,233 B1
DATED          : November 6, 2001
INVENTOR(S)    : Kurosawa et al.

It is certified that error appears in the above-identified patent and that said Letters Patent is hereby corrected as shown below:

<u>Title page, Item [54] and Column 1, lines 1 and 2,</u>
The Title should be -- CURABLE RESIN COMPOSITION AND CURED PRODUCTS --

Signed and Sealed this

Twenty-sixth Day of November, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO.   : 6,313,233 B1
DATED        : November 6, 2001
INVENTOR(S)  : Takahiko Kurusawa et al.

It is certified that error appears in the above-identified patent and that said Letters Patent is hereby corrected as shown below:

<u>Title page,</u>
Item [73], Assignee, "Japan Synthetic Rubber Co., Ltd., Tokyo (JP)" should read
-- [73] Assignee: JSR Corporation, Tokyo (JP) --.

Signed and Sealed this

Seventh Day of September, 2004

JON W. DUDAS
*Director of the United States Patent and Trademark Office*

UNITED STATES PATENT AND TRADEMARK OFFICE
CERTIFICATE OF CORRECTION

PATENT NO.    : 6,313,233 B1  
DATED         : November 6, 2001  
INVENTOR(S)   : Takahiko Kurosawa et al.

It is certified that error appears in the above-identified patent and that said Letters Patent is hereby corrected as shown below:

<u>Title page,</u>  
Item [73], Assignee, "Japan Synthetic Rubber Co., Ltd., Tokyo (JP)" should read -- [73] Assignee: JSR Corporation, Tokyo (JP) --.

This certificate supersedes Certificate of Correction issued September 7, 2004.

Signed and Sealed this

Twelfth Day of October, 2004

JON W. DUDAS  
*Director of the United States Patent and Trademark Office*